(12) United States Patent
Breinlinger

(10) Patent No.: US 8,130,005 B2
(45) Date of Patent: Mar. 6, 2012

(54) ELECTRICAL GUARD STRUCTURES FOR PROTECTING A SIGNAL TRACE FROM ELECTRICAL INTERFERENCE

(75) Inventor: Keith J. Breinlinger, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 1098 days.

(21) Appl. No.: 11/610,925

(22) Filed: Dec. 14, 2006

(65) Prior Publication Data
US 2008/0143358 A1 Jun. 19, 2008

(51) Int. Cl.
*G01R 31/02* (2006.01)
*G01R 31/00* (2006.01)
(52) U.S. Cl. .............................. 324/754.11; 324/756.03
(58) Field of Classification Search .................. 324/72.5, 324/158.1, 754–755, 761–721, 750.15, 750.16, 324/750.24, 756.02, 762.01, 762.05; 439/66–72, 439/482, 824
See application file for complete search history.

(56) References Cited

U.S. PATENT DOCUMENTS 5,323,107 A 6/1994 D'Souza
(Continued)

OTHER PUBLICATIONS

International Search Report PCT/US 07/085480 (Aug. 1, 2008).

*Primary Examiner* — Huy Q Phan
*Assistant Examiner* — Joshua Benitez
(74) *Attorney, Agent, or Firm* — Kirton & McConkie

(57) ABSTRACT

A method of fabricating a guard structure can include depositing an insulating material over at least a portion of electrical signal conductors disposed on a component of a probe card assembly, and depositing an electrically conductive material onto the insulating material and at least a portion of electrical guard conductors disposed on the component of the probe card assembly. Each signal conductor can be disposed between a pair of the guard conductors. The probe card assembly can include a plurality of probes disposed to contact an electronic device to be tested. The signal conductors can be part of electrical paths within the probe card assembly to the probes.

20 Claims, 15 Drawing Sheets

U.S. PATENT DOCUMENTS

| | | |
|---|---|---|
| 5,436,565 A | 7/1995 | Gammell |
| 5,669,973 A | 9/1997 | Pletcher |
| 6,114,864 A * | 9/2000 | Soejima et al. .......... 324/756.03 |
| 6,603,322 B1 | 8/2003 | Boll et al. |
| 6,861,856 B2 * | 3/2005 | Dunklee et al. .......... 324/754.03 |
| 7,148,714 B2 | 12/2006 | Tervo et al. |
| 7,196,531 B2 | 3/2007 | Grube et al. |
| 7,355,420 B2 * | 4/2008 | Smith et al. ................... 324/754 |
| 7,403,025 B2 * | 7/2008 | Tervo et al. ................... 324/754 |
| 7,492,175 B2 * | 2/2009 | Smith et al. ................... 324/754 |
| 7,498,828 B2 * | 3/2009 | Dunklee et al. .......... 324/756.01 |
| 7,622,935 B2 * | 11/2009 | Hobbs et al. ................... 324/754 |
| 7,639,003 B2 * | 12/2009 | Dunklee et al. .......... 324/756.01 |
| 2005/0151557 A1 * | 7/2005 | Tervo et al. ................... 324/762 |
| 2007/0139061 A1 | 6/2007 | Eldridge et al. |
| 2007/0205780 A1 | 9/2007 | Eldridge |

* cited by examiner

ELECTRICAL GUARD STRUCTURES FOR PROTECTING A SIGNAL TRACE FROM ELECTRICAL INTERFERENCE

BACKGROUND

It has been known to dispose electrical conductors, such as conductive traces, on a substrate for the purpose of driving electrical signals through the traces. For example, it has been known to drive test signals through traces on a testing substrate to terminals of an electronic device being tested. Depending upon the application and ambient conditions, various forms of electrical interference can interfere with and/or distort the signals on the traces. For example, ambient electromagnetic radiation can interfere with and/or distort the signals on the traces. As another example, a signal on one trace on the substrate can interfere with and distort a signal on another of the traces on the substrate. Cross-talk between two nearby traces, which can be caused by capacitive and/or inductive coupling between the two traces, is one exemplary form of such interference and distortion. In some applications, it is desirable to reduce or eliminate such forms of electrical interference.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

Figure 1:
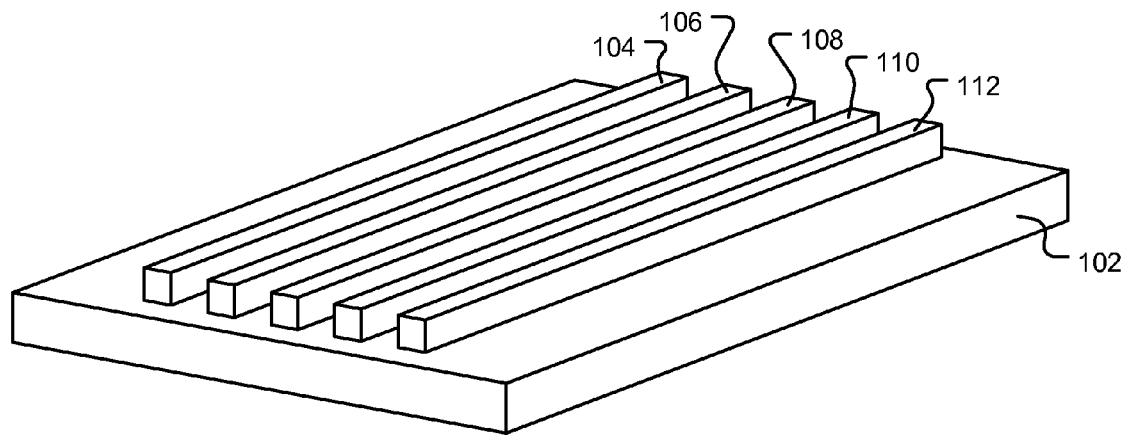
FIG. 1 illustrates a simplified, partial view of an exemplary substrate with electrically conductive traces according to some embodiments of the invention.

FIG. 1 illustrates an exemplary substrate 102 with a plurality of electrically conductive traces 104, 106, 108, 110, 112, and FIGS. 2-7 illustrate an exemplary process for creating electrical guard structures in which traces 106 and 110 can be configured as signal traces and traces 104, 108, and 112 can be configured as guard traces for electrically guarding the signal traces 106 and 110 according to some embodiments of the invention. For ease of illustration and discussion, FIGS. 1-7 show only a partial view of substrate 102 and traces 104, 106, 108, 110, 112.

Substrate 102 can be any substrate suitable for supporting electrically conductive traces, including without limitation a ceramic substrate, a printed circuit board, a semiconductor material, etc., and many traces (like traces 104, 106, 108, 110, 112) can be disposed on or within the substrate 102. Moreover, as illustrated in FIGS. 3, 5, and 7, one or more electrically conductive planes 302 can be embedded within the substrate 102, and electrical connections can be provided to the plane 302 in the form of, for example, electrically conductive vias 304, 306, 308 (three are shown but more or fewer can be included). As shown in FIGS. 3, 5, and 7, electrically conductive vias 304, 306, 308 can be provided to connect electrically the guard traces 104, 108, 112 to the plane 302. The configurations shown in FIGS. 1-7 are, however, exemplary only, and many modifications are possible. For example, substrate 302 need not include plane 302 and vias 304, 306, 308.

Traces 104, 106, 108, 110, 112 can be electrically connected to other electrical or electronic elements (not shown) on the substrate 102. For example, one or more of the traces 104, 106, 108, 110, 112 can be electrically connected to terminals, vias, other traces, electronic components, an input or output of an electronic circuit, etc. (not shown) on or in the substrate 102. As will be discussed, for purposes of the example discussed herein, traces 106 and 110 (herein after referred to as traces or signal traces) can be configured to carry a signal, and traces 104, 108, 112 (herein after referred to sometimes as traces or guard traces) can be configured as guard traces.

The traces 104, 106, 108, 110, 112 can be fabricated on the substrate 102 or can be separately fabricated and attached to the substrate 102 (e.g., by gluing or otherwise adhering the traces 104, 106, 108, 110, 112 to the substrate). For example, the traces 104, 106, 108, 110, 112 can comprise one or more conductive materials deposited onto the substrate 102. As another example, traces 104, 106, 108, 110, 112 can comprise conductive strips (e.g., strips of copper or other conductive materials) that are adhered (e.g., glued) to the substrate 102.

Figure 18:
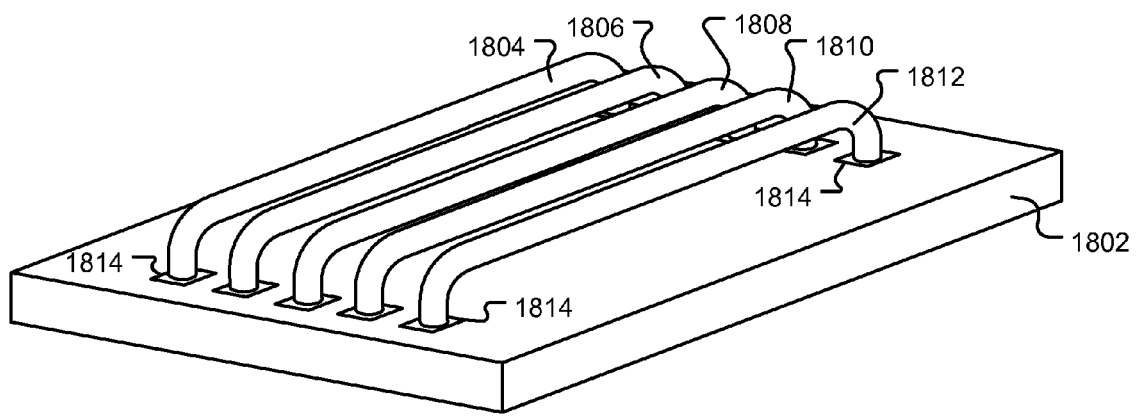
FIG. 18 illustrates exemplary use of bonded wires in place of traces according to some embodiments of the invention.

As yet another example, the traces 104, 106, 108, 110, 112 can comprise wires as shown in FIG. 18.

Figure 2:
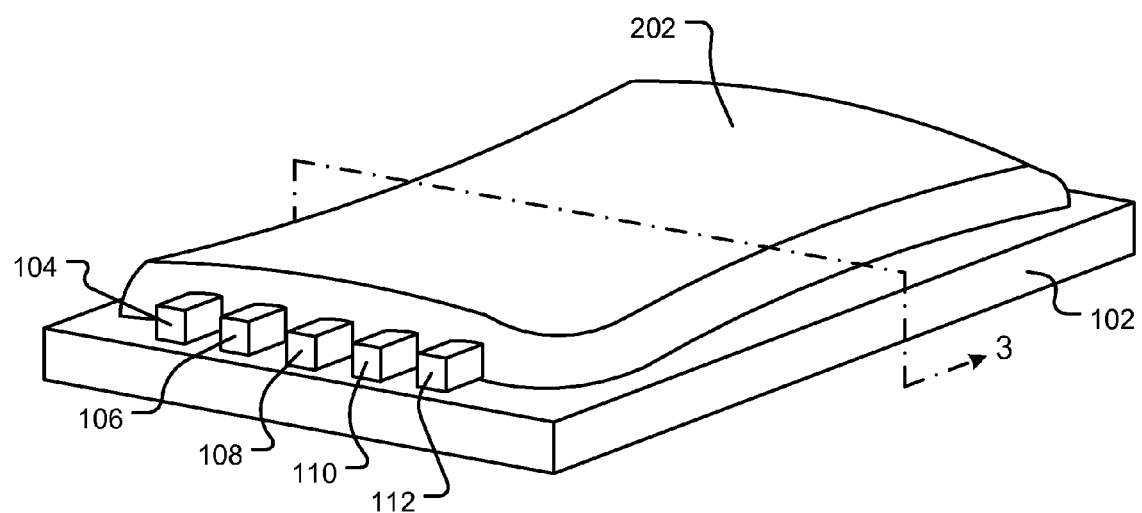
FIGS. 2 and 3 illustrate deposit of an exemplary insulating material over at least a portion of the traces of FIG. 1 according to some embodiments of the invention.
Figure 3:
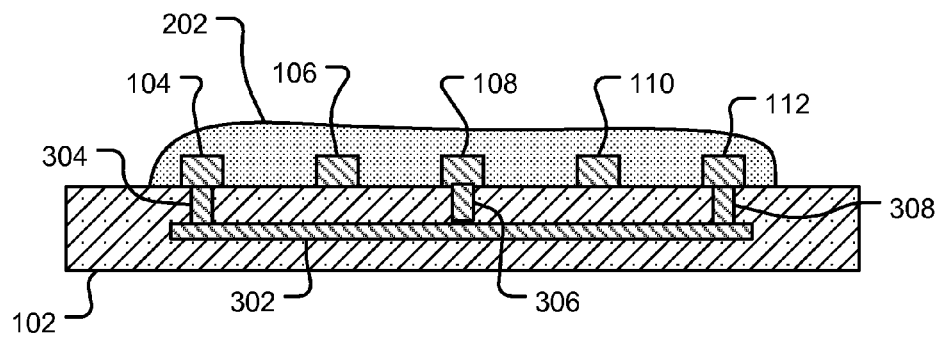

As shown in FIGS. 2 and 3 (FIG. 3 shows a cross-sectional view taken from FIG. 2), an electrically insulating material 202 (e.g., a dielectric material) can be deposited over the traces 104, 106, 108, 110, 112. Any material that has electrically insulating properties can be used. For example, without limitation, insulating material 202 can comprise an electrically insulating or semiconductor material such as an epoxy, a ceramic, a plastic, a semiconductor, or any other material that can be an electrical insulator or semiconductor. Some non-limiting examples of such material include alumina, silicon dioxide, parylene, and silicon. The insulating material 202 can be deposited on the substrate 102 and the traces 104, 106, 108, 110, 112 in any manner suitable for depositing an insulating material. For example, the insulating material 202 can be sprayed, dispensed, brushed, molded, or poured on or otherwise applied to the substrate 102 and the traces 104, 106, 108, 110, 112. Moreover, the insulating material 202 can cover all or only portions of the traces 104, 106, 108, 110, 112.

Figure 4:
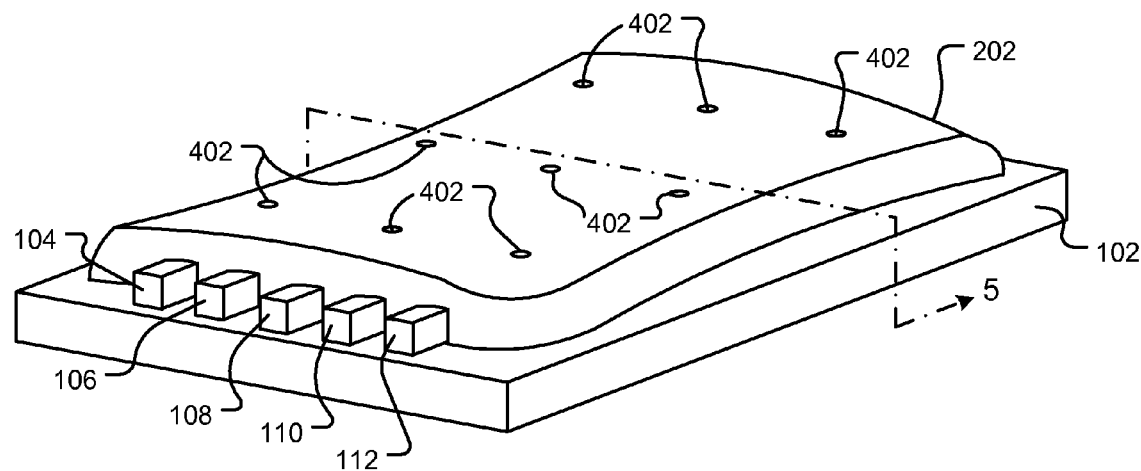
FIGS. 4 and 5 illustrate formation of holes through the insulating material of FIGS. 2 and 3 to the traces according to some embodiments of the invention.
Figure 5:
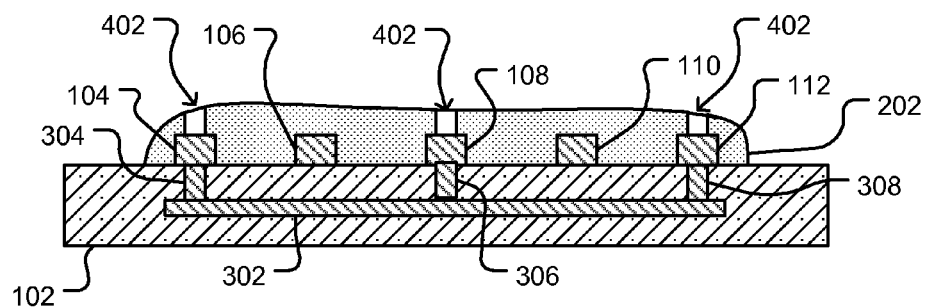

As shown in FIGS. 4 and 5 (FIG. 5 shows a cross-sectional view taken from FIG. 4), holes 402 can be formed in the insulating material 202, and holes 402 can extend to and expose portions of the guard traces 104, 108, 112. The holes 402 can be formed in any manner suitable for forming holes in an insulating material 202. For example, holes 402 can be etched or cut through the insulating material 202. As another example, holes 402 can be formed by lasers (not shown) (e.g., by ablation). As still another example, insulating material 202 can be a curable material (e.g., photoresist), and holes 402 can be formed be selectively curing the insulating material 202 and then removing uncured portions to form holes 402. Although illustrated with circular openings in FIG. 4, the openings of hole 402 can have any shape, including without limitation square, rectangular, oval, etc.

Figure 6:
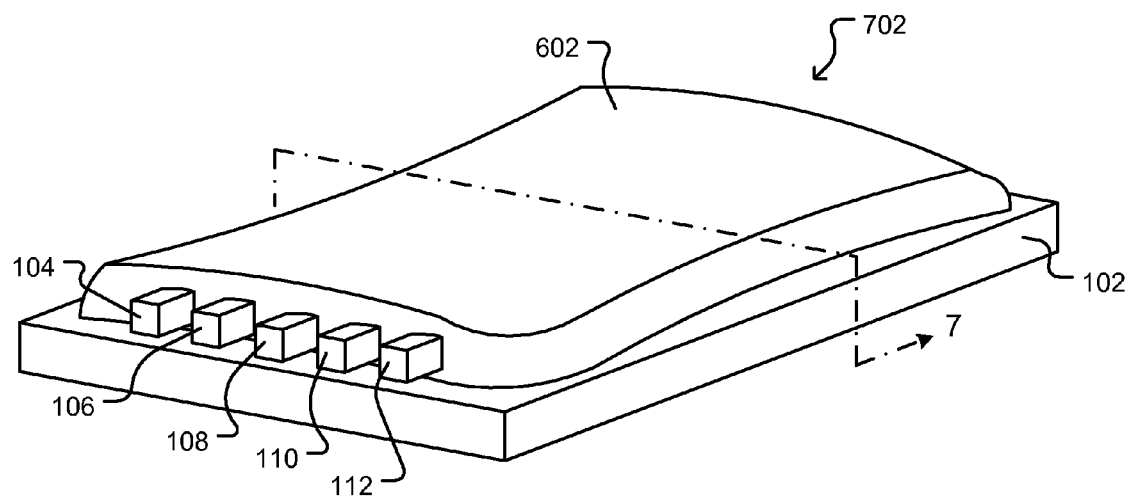
FIGS. 6 and 7 illustrate deposit of an exemplary conductive material over the insulating material with the holes of FIGS. 4 and 5 according to some embodiments of the invention.
Figure 7:
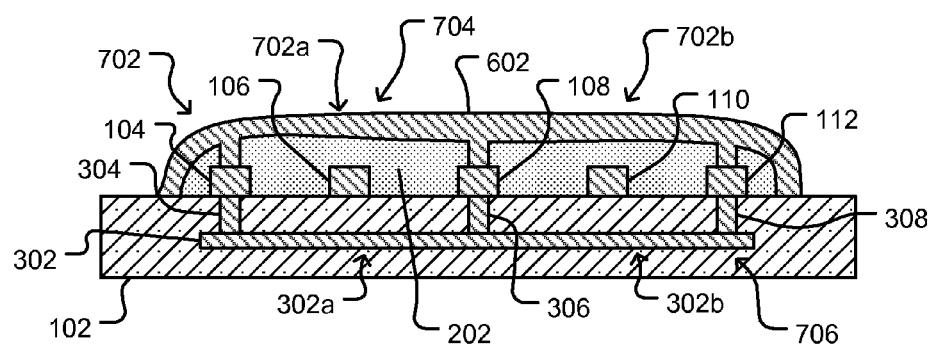

As shown in FIGS. 6 and 7 (FIG. 7 shows a cross-sectional view taken from FIG. 6), an electrically conductive material 602 can be deposited over the insulating material 402. As best seen in FIG. 7, the conductive material 602 can electrically connect to the guard traces 104, 108, 112. For example, the conductive material 602 can fill (fully or partially) holes 402. The conductive material 602 can be any electrically conductive material. Non-limiting examples of conductive material 602 can include any conductive metal (e.g., copper, etc.), a conductive paste, a conductive polymer, etc. The conductive material 602 can be deposited in any manner suitable for depositing such material. Non-limiting exemplary techniques for depositing the conductive material 602 include electroplating, chemical vapor deposition, physical vapor deposition, sputter deposition, electroless plating, electron beam deposition, evaporation (e.g., thermal evaporation), flame spring coating, plasma spray coating, etc.

Configured as shown in FIGS. 6 and 7, the conductive material 602 can form an electrically conductive cover structure 702 that is electrically connected to the guard traces 104, 106, 112. As discussed above, vias 304, 306, 308 can electrically connect the guard traces 104, 106, 112 to the plane 302. The cover structure 702, guard traces 104, 108, 112, vias 304, 306, 308, and plane 302 can form guard structures that electrically protect the signal traces 106, 110. For example, the following can form a guard structure 704 that electrically protects signal trace 106: guard traces 104, 108; vias 304, 306; the portion 302a of plane 302 between vias 304, 306; and the portion 702a of the cover structure 702 between guard traces 104, 108. The following can form another guard structure 706 that electrically protects signal trace 110: guard traces 108, 112; vias 306, 308; the portion 302b of plane 302 between vias 306, 308; and the portion 702b of the cover structure 702 between guard traces 108, 112. Multiple vias 304 can be disposed in and out of the page of FIG. 7 along the length of guard trace 104. Similarly, multiple vias 306 can be disposed in and out of the page of FIG. 7 along the length of guard trace 108, and multiple vias 308 can be disposed in and out of the page of FIG. 7 along the length of guard trace 112.

The guard structures 704, 706 can protect all or part of the signal traces 106, 110 from electrical interference, such as cross talk from another signal trace (e.g., guard structure 704 can protect signal trace 106 from cross talk from signal trace 110); capacitive and/or inductive coupling with another signal trace (e.g., guard structure 704 can protect signal trace 106 from capacitive and/or inductive coupling with signal trace 110); ambient electromagnetic radiation; etc. Guard structures 704, 706 can be electrically connected to a voltage potential (e.g., ground, a particular voltage, etc.). For example, one or more of the following can be electrically connected to a voltage potential (e.g., ground, a particular voltage, etc.): cover structure 702, a guard trace 104, 108, 112, and/or a via 304, 306, 308. One or more connections to the voltage potential can be within substrate 102. The guard structures 704, 706 can also or alternatively be used to control an impedance of the signal traces 106, 110. For example, signal traces 106, 110 can be connected to a force line of a power supply, and the guard structures 704, 706 can be connected to a return line of the power supply. As another alternative, insulating material 202 can comprise a dielectric material, or a dielectric coating, which can be deposited and formed by, for example, molding, hot embossing, laser ablation, etc.

Figure 8:
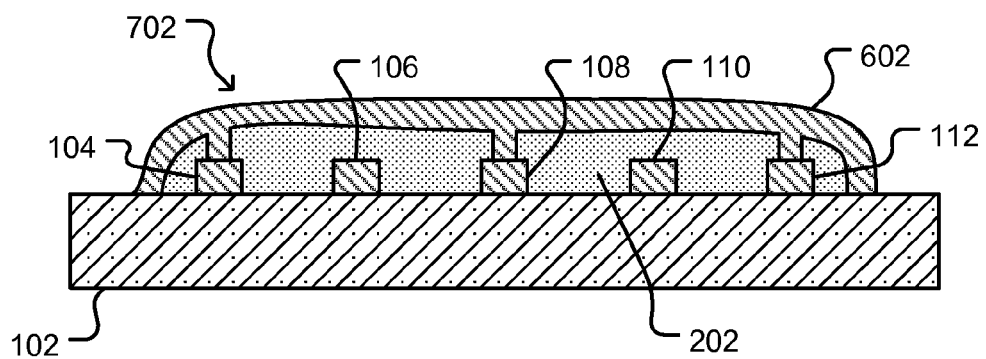
FIGS. 8-12 illustrate exemplary alternative configurations of the device shown in FIGS. 6 and 7 according to some embodiments of the invention.

As mentioned above, the configuration shown in FIGS. 6 and 7 is exemplary only, and many modifications are possible. For example, as shown in FIG. 8, substrate 102 need not include conductive plane 302 and vias 304, 306, 308, although substrate 102 can include one or more other conductive planes (not shown) and other conductive vias (not shown). In such a configuration, the guard traces 104, 108, 112 can nevertheless protect signal traces 106, 110 from electrical interference such as cross talk between signal traces 106, 110 (and/or other signal traces (not shown) on or in substrate 102), capacitive and/or inductive coupling between signal traces 106, 110 (and/or other signal traces), ambient electromagnetic signals, etc. As shown, the cover structure 702 can electrically connect the guard traces 104, 108, 112 one to another. A voltage potential (e.g., ground, a particular voltage, etc.) can be provided to one or more of the guard traces 104, 108, 112 and/or to the cover structure 702. Alternatively, more than one source of a voltage potential can be provided to one or more of the guard structures 104, 108, 112 and/or to the cover structure 702.

FIGS. 9-12 illustrate additional non-limiting examples of modifications to the configuration shown in FIGS. 6 and 7 according to some embodiments of the invention.

Figure 9:
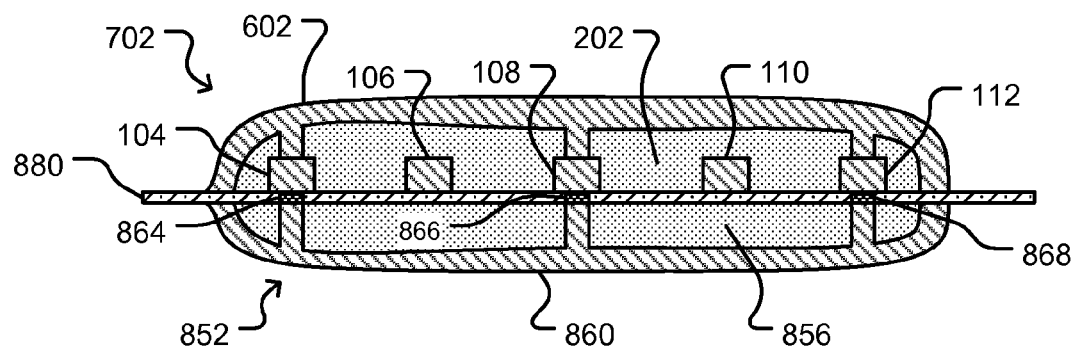

FIG. 9 illustrates an example in which substrate 102 can be replaced with a thin substrate 808. Guard traces 104, 108, 112, signal traces 106, 110, insulating material 202 and cover structure 702 can nevertheless by the same as or generally similar to like named and numbered elements in FIGS. 6 and 7 and can be formed or fabricated in the same or similar ways. Substrate 880 can be, for example, a flex substrate or any other thin substrate suitable for supporting electrically conductive traces. As shown, the configuration of FIG. 9 can have a cover structure 852 formed on an opposite surface of the substrate 880. The cover structure 852 can comprise conductive material 860 disposed on insulating material 856 and electrically connected to guard structures 104, 108, 112 by electrically conductive vias 864, 866, 868 through the substrate 880. The insulating material 856 can be like and can be deposited like insulating material 202 of FIGS. 6 and 7, and the conductive material 860 can be like and can be deposited like conductive material 602 of FIGS. 6 and 7. As should be apparent, the cover structures 702, 852, the guard traces 104, 108, 112, and the vias 864, 866, 868 can form electrical guard structures for electrically protecting each signal trace 106, 110 from electrical interference, as generally discussed above. In some embodiments, the cover structures 702, 852 can be sized and located such that each signal trace 106, 110 is located an equal distance or approximately an equal distance from the cover structures 702, 852. In some embodiments, signal trace 106 can be located an equal distance or approximately an equal distance from each of guard traces 104, 108, and signal trace 110 can also be located an equal distance or approximately an equal distance from each of guard traces 108, 112. In some embodiments, signal trace 106 can be located the same or approximately the same distance from each of the guard trace 104, the cover structure 702, the guard trace 108, and the cover structure 852; and the signal trace 110 can likewise be located the same or approximately the same distance from each of the guard trace 108, the cover structure 702, the guard trace 112, and the cover structure 852. The foregoing can aide in controlling impedance of signal traces 106, 110 and/or reducing conductor losses, particularly for high frequency signals on signal traces 106, 110.

Figure 10:
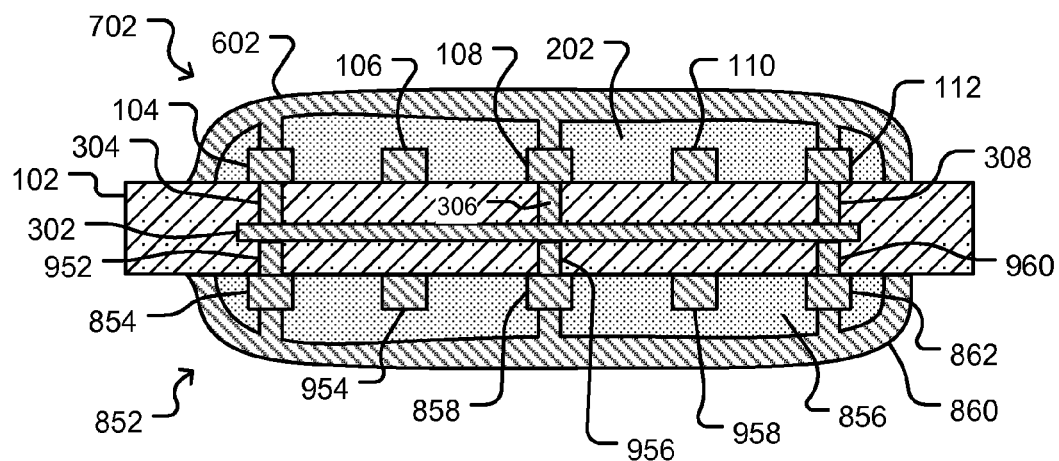

The exemplary configuration shown in FIG. 10 can be generally similar to the configuration shown in FIG. 9 except that the configuration of FIG. 10 can include substrate 102 with conductive plane 302; electrically conductive vias 304, 306, 308 electrically connecting guard traces 104, 108, 112 to plane 302; and electrically conductive vias 952, 956, 960 electrically connecting guard traces 854, 858, 862 to the plane 302. As shown, the configuration of FIG. 10 can also include signal traces 954, 958 on a surface of substrate 102 opposite the surface on which signal traces 106, 110 are located. As should be apparent, cover structure 702, vias 304, 306, 308, and plane 302 can form guard structures that electrically protect signal traces 106, 110, as generally discussed above. In addition, cover structure 852, vias 952, 956, 960, and plane 302 can form guard structures that electrically protect signal traces 954, 958 (which can be like signal traces 106, 110).

Figure 11:
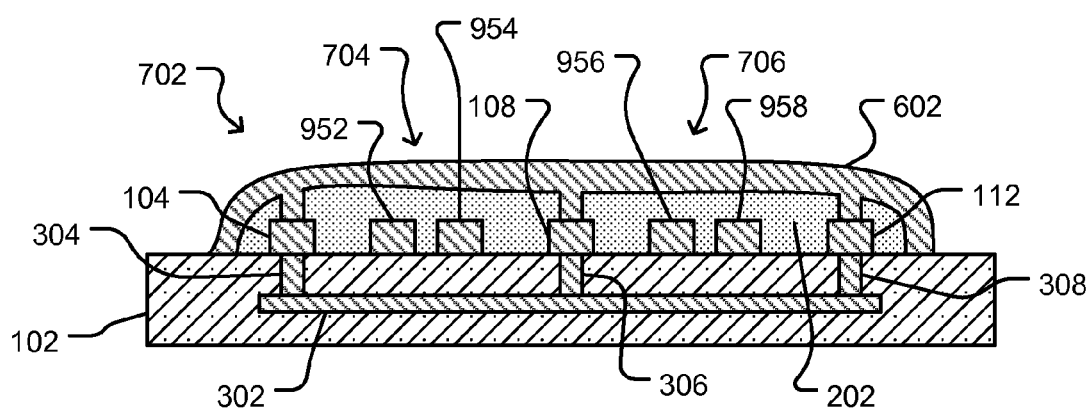

FIG. 11 illustrates an exemplary configuration that can be generally similar to the configuration shown in FIG. 7 except that the guard structure 704 (comprising, as discussed above, part of the cover structure 702; guard traces 104, 108; vias 304, 306; and part of plane 302) can protect signal traces 952, 954 configured as differential pairs. Similarly, the guard structure 706 (comprising, as also discussed above, part of the cover structure 702; guard traces 108, 112; vias 306, 308; and part of plane 302) can protect signal traces 956, 958, which can also be configured as differential pairs.

Figure 12:
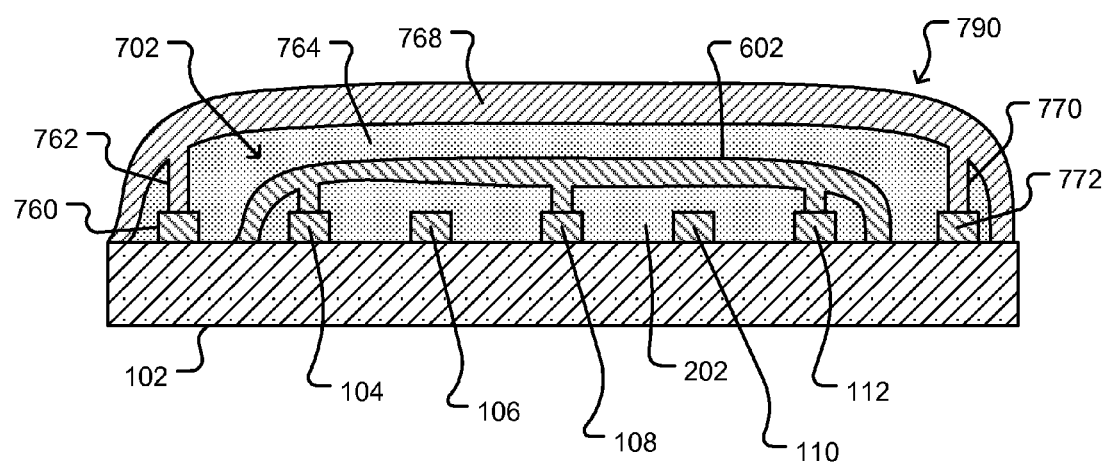

FIG. 12 illustrates another exemplary configuration that can be generally similar to the configuration shown in FIG. 9 but can additionally include a second guard structure 790 disposed on insulating material 764, which in turn can be disposed on guard structure 702. As shown, the configuration of FIG. 12 can also include additional guard traces 760, 772 (which can be generally similar to guard traces 104, 108, 112) disposed on the substrate 102. The insulating material 764 can be disposed onto the substrate 102 and over the guard traces 760, 772 and the cover structure 702. Insulating material 764 can be generally similar to and can be deposited like insulating material 202. Holes (not shown) can be formed in the insulating material 764 to the guard traces 760, 772. Such holes (not shown) can be like and can be formed like holes 402 of FIGS. 4 and 5. An electrically conductive material 768 can be deposited over the insulating material 764 to form the cover structure 790. The electrically conductive material 768 can fill the holes (not shown) to the guard traces 760, 772, forming via-like structures 762, 770 electrically connecting the cover structure 790 to the guard traces 760, 772 as shown in FIG. 12. Alternately, the holes (not shown) to the guard traces 760, 772 can be filled with an electrically conductive material prior to depositing electrically conductive material 768 onto the insulating material 764. Electrically conductive material 768 can be like and can be deposited like electrically conductive material 602 (see FIGS. 6 and 7). The second cover structure 790 and/or the guard traces 760, 772 can be electrically connected to a voltage source (e.g., ground or a particular voltage level). A tri-axial electrical structure can thus be formed. The foregoing structure can alternatively be used for low inductance power delivery from a power source (not shown). In such a configuration, one of cover structure 790 or cover structure 702 can be connected to the force line of the power source (not shown), and the other of the cover structure 790 or the cover structure 702 can be connected to the return line of the power source (not shown).

Although not shown in FIG. 12, substrate 102 can comprise an electrically conductive plane (not shown) like plane 302, and one or more of the guard traces 760, 104, 108, 112, 772 can be electrically connected to the plane (not shown) by electrically conductive vias (not shown), which can be like vias 304, 306, 308. In some embodiments, mirror images of each of the elements shown on the top surface of substrate 102 can be formed on the bottom surface of substrate 102 and electrically connected one to another by electrically conductive vias (not shown) through substrate 102.

Guard structures, like any of the guard structures (including any modifications) discussed above, can be formed on and used in many different types of electrical devices and electrical components. For example, such guard structures can be formed on signal traces on a semiconductor die. As another example, such guard structures can be formed on signal traces on a printed circuit board. Moreover, one or more guard structures can be formed on one or more sets of signal traces on an electronic device.

Figure 13:
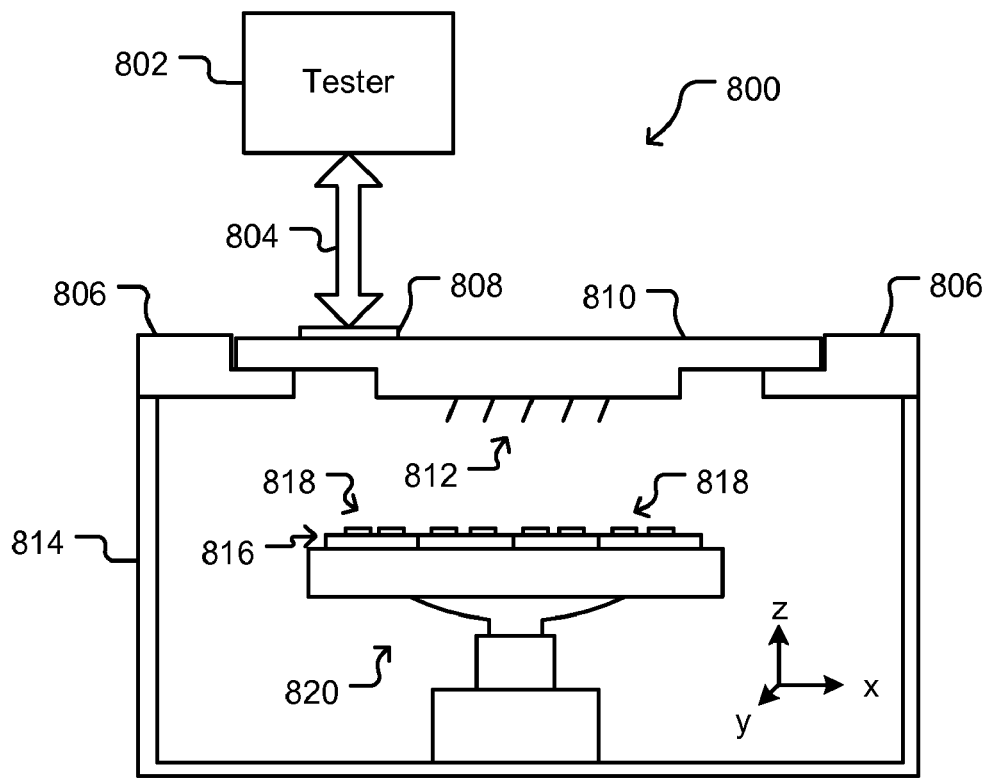
FIG. 13 illustrates an exemplary test system according to some embodiments of the invention.
Figure 14:
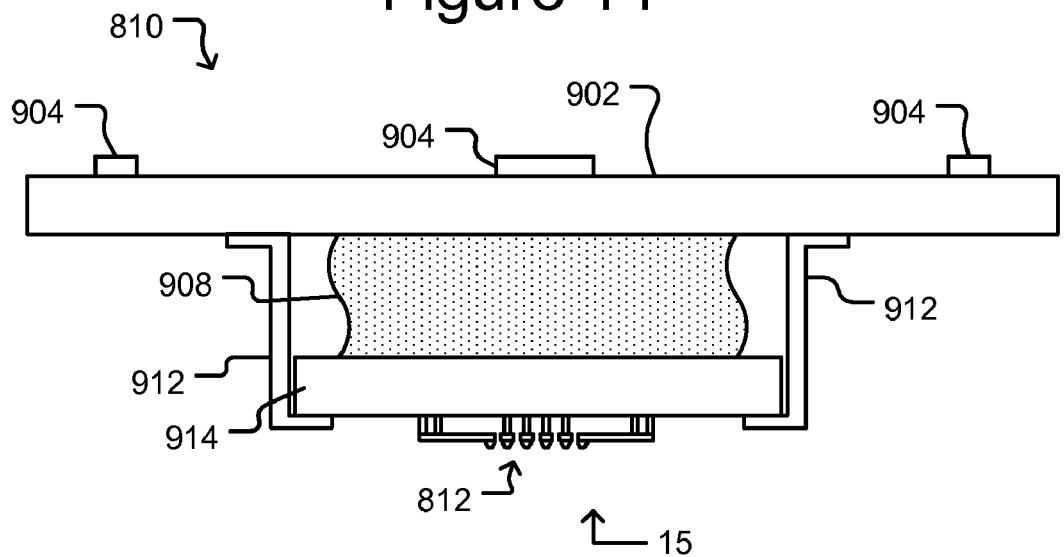
FIG. 14 illustrates an exemplary probe card assembly that can be used in the test system of FIG. 13 according to some embodiments of the invention.

FIGS. 13-17 illustrate another exemplary use of guard structures, like any of the exemplary guard structures shown in FIGS. 6-12, according to some embodiments of the invention. FIG. 13 illustrates a block diagram of an exemplary test system 800, which can be used to test one or more electronic devices under test (hereinafter "DUT") 816 according to some embodiments of the invention, and FIG. 14 illustrates a block diagram of an exemplary probe card assembly 810 that can be used in the system 800. As used herein, the term "DUT" can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and any other type of electronic device or devices. DUT 816 can thus be one or more of any of the foregoing devices or similar devices.

As shown in FIG. 13, test system 800 can comprise a tester 802, which can generate test signals to be input into the DUT 816. Tester 802 can also evaluate response signals generated by the DUT 816 in response to the test signals. Tester 802 can comprise equipment such as one or more computers. The tester 802 can be electrically connected to the DUT 816 through a plurality of communications channels 804 and a probe card assembly 810. The communications channels 804 can be a plurality of electrical paths between the tester 802 and an electrical interface 808 on the probe card assembly 810. Any mechanism or medium can be used to provide the communications channels 804. For example, communications channels 804 can comprise coaxial cables, fiber optics, wireless transmitters and receivers, twisted pairs, electric circuits, driver circuits, receiving circuits, etc. Moreover, each of channels 804 can comprise multiple medias. For example, ones of channels 804 can comprise a driver circuit that drives a signal down a coaxial cable to a routing circuit on one or more circuit boards, which in turn provides the signal to an electrical connector that can be connected to the electrical interface 808 (e.g., 904 of FIG. 14) on the probe card assembly 810.

As shown, the probe card assembly 810 can comprise an electrical interface 808 and a plurality of electrically conductive probes 812. The electrical interface 808 can comprise any mechanism for providing electrical connections to the communications channels 804. For example, the electrical interface 808 can comprise zero-insertion-force ("ZIF") electrical connectors configured to receive mating ZIF connectors (not shown) at the end of the communications channels 804. As another non-limiting example, electrical interface 808 can comprise pogo pin pads configured to receive pogo pin electrical connectors at the end of communications channels 804.

The probes 812 can be disposed in a pattern that corresponds to a pattern of input and/or output terminals 818 of the DUT 816. The probes 812 can be resilient, conductive structures. Non-limiting examples of suitable probes 812 include composite structures formed of a core wire bonded to a conductive terminal (not shown) on the probe card assembly 810, and the core wire can be over coated with a resilient material as described in U.S. Pat. No. 5,476,211, U.S. Pat. No. 5,917,707, and U.S. Pat. No. 6,336,269. Probes 812 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes 812 are disclosed in U.S. Pat. No. 6,827,584, U.S. Pat. No. 6,640,432, U.S. Pat. No. 6,441,315, and U.S. Patent Application Publication No. 2001/0012739. Other non-limiting examples of probes 812 include electrically conductive pogo pins, bumps, studs, stamped springs, needles, buckling beams, etc.

The probe card assembly 810 can comprise a plurality of electrical paths (not shown) between the electrical interface 808 and the probes 812. Ones of the channels 804 can thus be electrically connected to ones of the probes 812.

As shown in FIG. 13, the DUT 816 can be placed on a moveable holding device 820 (e.g., a moveable chuck mechanism) located in a housing 814 (e.g., a box like structure). The holding device 820 can be moveable along the "x," "y," and "z" axes and can be further capable of rotating about those axes. (Note that the "y" axis in FIG. 12 is into and out of the page but is shown askew in FIG. 13 for purposes of illustration.) The housing 814 can be, for example, a prober such is commonly used in a semiconductor die probing system. The probe card assembly 810 can be secured to a head plate 806 of the housing 814. For example, the probe card assembly 810 can be bolted, clamped, screwed, or otherwise attached to the head plate 806.

Test system 800 can be operated as follows to test DUT 816. Probe card assembly 810 can be attached to the head plate 806, and electrical interface 808 can be electrically connected to channels 804. DUT 816 can be placed on the holding device 820, which can move the DUT 816 generally in the "x, y" plane to align ones of the terminals 818 of the DUT 816 with ones of the probes 812. The holding device 820 can then move the DUT 816 generally along the "z" axis until ones of the terminals 816 are pressed against—and thus make electrical connections with—ones of the probes 812. Power and ground can be provided from tester 802 through channels 804 and probe card assembly 810 to power the DUT 816, and the tester 802 can drive test signals down the communications channels 804 to the probe card assembly 810 and into the DUT 816. Response signals generated by the DUT 816 in response to the test signals can be provided through the probe card assembly 810 and the channels 804 to the tester 802, which can analyze the response signals to determine whether the DUT 816 passed the testing. If DUT 816 comprises multiple electronic devices, the foregoing test process might test less than all of the electronic devices that compose the DUT 816. If such is the case, after testing some of the devices of DUT 816 as described above, the holding device 820 can move the DUT 816 so that other terminals 818 are brought into contact with the probes 812. Other electronic devices of DUT 816 can thus be tested.

As mentioned, FIG. 14 illustrates a block diagram of an exemplary probe card assembly 810 according to some embodiments of the invention. As shown, probe card assembly 810 can comprise a first structure 902 on which can be disposed electrical connectors 904 that compose the electrical interface 808. Electrical connectors 904 can thus be ZIF connectors, pogo pads, or any other electrical connection mechanism that can be connected to channels 804. The first structure 902 can comprise a wiring substrate (e.g., a printed circuit board) (not separately shown), which can comprise a plurality of electrically conductive traces and/or vias (not shown) on, in, and/or through the wiring substrate that provide a plurality of electrically conductive paths through the wiring substrate to a flexible electrical connector 908. The first structure 902 can also comprise an attachment mechanism (not separately shown) by which the probe card assembly 810 can be attached to the head plate 806 (see FIG. 13). In some embodiments, the attachment mechanism (not separately shown) can be the wiring substrate (not separately shown). In other words, in some embodiments, the wiring substrate can also be the attachment mechanism. In other embodiments, the wiring substrate and the attachment mechanism can be different structures.

The flexible electrical connector 908 can provide a plurality of electrically conductive paths (not shown) from the wiring substrate (not separately shown) of the first substrate 902 to a probe head assembly 914, which can comprise a plurality of electrical paths (e.g., electrically conductive traces and/or vias on, in, or through the probe head assembly 914). The electrical interface 808 (e.g., 904 in FIG. 14), conductive paths (not shown) through the wiring substrate (not separately shown), the flexible electrical connector 908, and the probe head assembly 914 can thus provide individual electrical connections between ones of the channels 804 and ones of the probes 812, which in turn can make electrical connections with ones of DUT terminals 818. Brackets 912 and/or other attachment mechanisms (e.g., clamps, bolts, screws, etc.) can hold the probe head assembly 914, flexible electrical connector 908, and first structure 902 together.

The flexible electrical connector 908 can comprise any type of electrical connections that are sufficiently flexible (or compliant) to maintain electrical connections between the wiring substrate (not separately shown) of the first structure 902 and the probe head assembly 914 even if the probe head assembly 914 is moved relative to the mounting mechanism (not separately shown) of the first structure 902. Although not shown, the probe card assembly 810 can comprise a mechanism for moving (e.g., rotating, tilting, translating, etc.) the probe head assembly 914 with respect to the mounting mechanism (not separately shown) of the first structure 902. Examples of such mechanisms are disclosed in U.S. Pat. No. 5,974,662; U.S. Pat. No. 6,509,751; and U.S. patent application Ser. No. 11/306,515, filed Dec. 30, 2005. For example, electrical connector 908 can comprise flexible wires. As another example, electrical connector 908 can comprise an interposer (e.g., like the interposer 504 disclosed in FIG. 5 of U.S. Pat. No. 5,974,662).

The probe head assembly 914 can take many different forms and designs. For example, the probe head assembly 914 can comprise a single substrate to which probes 812 are attached. Alternatively, the probe head assembly 914 can comprise a plurality of probe substrates (not shown) to which the probes 812 are attached, and those probe substrates can be attached to a larger substrate (not shown) or otherwise attached to each other. Each such probe substrate can be independently moveable with respect to the larger substrate. Examples of multiple substrate probe head assemblies 812 are disclosed in U.S. patent application Ser. No. 11/165,833, filed Jun. 24, 2005 and U.S. patent application Ser. No. 11/306,515, filed Dec. 30, 2005.

Figure 15:
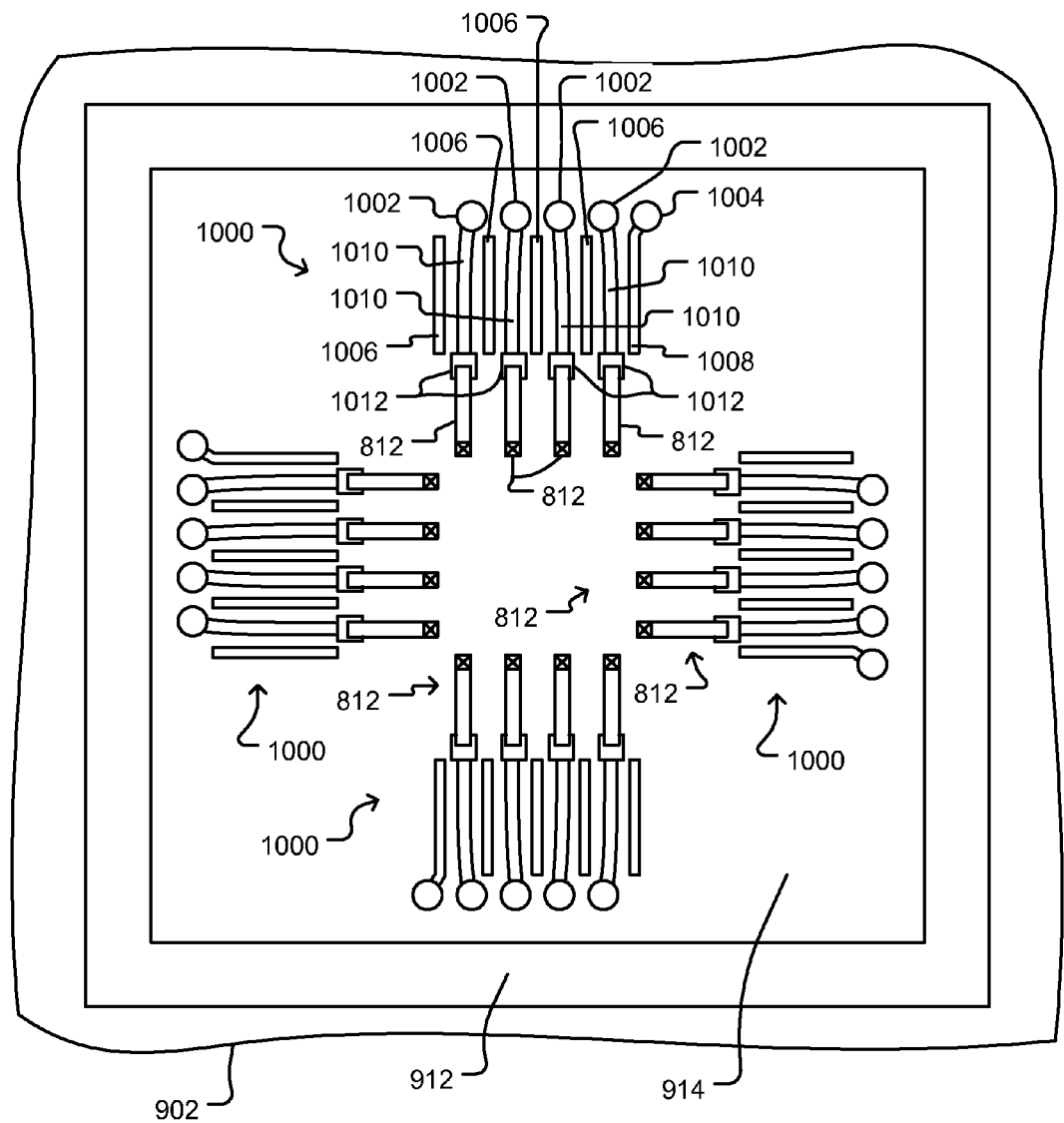
FIG. 15 illustrates a bottom view of the probe head assembly of the probe card assembly of FIG. 14.

FIG. 15 shows a bottom view of the probe card assembly 810 of FIG. 14. The view shown in FIG. 15 shows only a partial view of the first structure 902. As shown in FIG. 15, groups 1000 of electrically conductive via pads 1002, 1004, electrically conductive traces 1006, 1008, 1010, and electrically conductive pads 1012 can be disposed on the probe head assembly 914. Via pads 1002, 1004 can be connected to electrically conductive vias (not shown) that extend through the probe head assembly 914 to connections with the flexible electrical connector 908. Via pads 1002 can be for test signals or response signals and can be electrically connected by traces 1010 to pads 1012 to which probes 812 can be attached. Via pad 1004 can be electrically connected to a guard voltage potential (e.g., ground or a particular voltage level). As shown in FIG. 15, several groups 1000 of via pads 1002, 1004, traces 1006, 1008, 1010, and pads 1012 can be disposed on the probe head assembly 914 (four such groups 1000 are shown in FIG. 15 but more or fewer can be included in other configurations).

Figure 16:
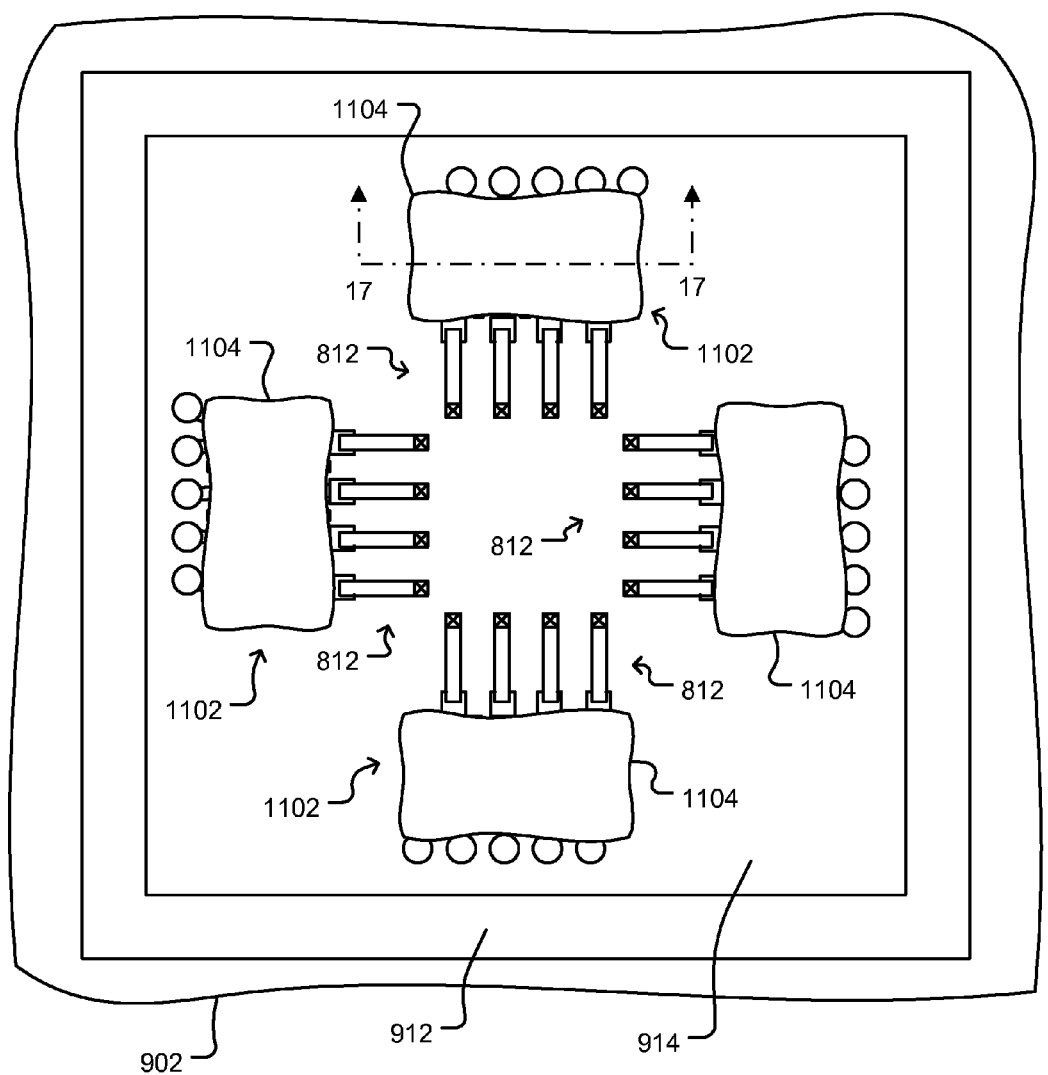
FIGS. 16 and 17 illustrate formation of structures comprise guard structures over traces on the probe head assembly of FIG. 15.
Figure 17:
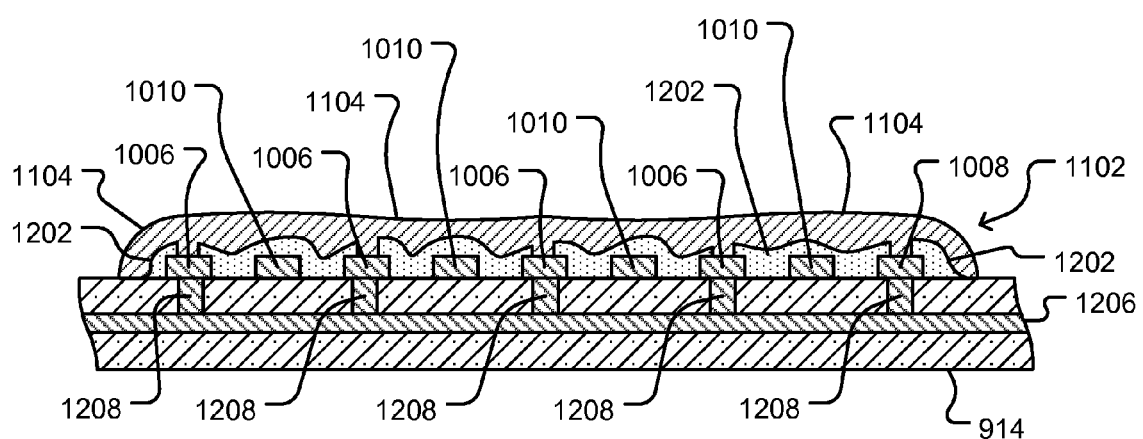

As shown in FIGS. 16 and 17, guard structures 1102 can be formed on part or all of the via/trace/pad groups 1000. As best seen in FIG. 17, a layer of insulating material 1202 can be deposited over the traces 1006, 1008, 1010 in each group 1000. Insulating material 1202 can be like insulating material 202 and can be deposited like insulating material 202. Holes (not shown in FIGS. 16 and 17) can be formed in the insulating material 1202 through to traces 1006, 1008. The holes (not shown) can be like holes 402, and can be formed like holes 402. A conductive material 1104 can then be deposited over the insulating material 1202. The conductive material 1104 can make electrical connections with traces 1006, 1008 through holes (not shown). The conductive material 1104 can be like conductive material 602 and can be deposited like conductive material 602. As shown in FIG. 17, the probe head assembly 914 can include one or more embedded conductive planes 1206, which can be electrically connected to traces 1006, 1008 by electrically conductive vias 1208. As can also be seen in FIG. 17, the structure 1102—comprising conductive plane 1206; vias 1208; traces 1006, 1008; and conductive material 1104—can provide guard structures (like guard structures 704, 706) around each of traces 1010. As mentioned, trace 1008 can be electrically connected to ground or another voltage potential (e.g., through via pad 1004), which can be static or dynamic. Because the plane 1206, vias 1208, traces 1006, and conductive material 1104 are electrically connected to trace 1008, the plane 1206, vias 1208, traces 1006, and conductive material 1104 can also be electrically connected to ground or the other voltage potential, which as stated above, can be static or dynamic. In some embodiments, the conductive material 1104 can be patterned to create one or more traces for power and/or electrical signals.

Consistent with the discussion above regarding guard structures 704, 706, the structure 1102 can guard the traces 1010—which, as discussed above, can be configured to carry test signals to DUT 816 and response signals from DUT 816. For example, structure 1102 can guard each trace 1010 against cross-talk and/or other forms of electrical interference. As another example, structure 1102 can guard the traces 1010 against interference from ambient electromagnetic interference. As also discussed above, structure 1102 can be used to control impedances of traces 1010.

Of course, the configuration shown in FIGS. 16 and 17 is exemplary only and many modifications are possible. For example, the probe head assembly 914 need not include plane 1206 and vias 1208. Even without plane 1206 and vias 1208, traces 1006, 1008 can guard against electrical interference between traces 1010. For example, traces 1006, 1008 can guard against cross-talk between traces 1010 and capacitive and/or inductive coupling of traces 1010 one with another. As another example, a structure, like structure 1102, comprising guard structures for signal traces can alternatively or additionally be formed on signal traces (e.g., like traces 1010) located on the opposite side of the probe head assembly 914 (the side of the probe head assembly 914 that faces the flexible electrical connector 908), on the wiring substrate (not shown but composing the first structure 902), or any other component or element of the probe card assembly 810. As still further examples, the configuration shown in FIGS. 16 and 17 can be modified in accordance with any of the examples shown in FIGS. 8-12.

FIG. 18 illustrates an exemplary substrate 1802 (which can be like substrate 102 of FIG. 1) with electrically conductive wires 1804, 1806, 1808, 1810, 1812 according to some embodiments of the invention. Although five wires 1804, 1806, 1808, 1810, 1812 are shown, more or fewer can be used. The wires 1804, 1806, 1808, 1810, 1812 can be bonded to terminals 1814 on the substrate 1802. The terminals 1814 can be electrically connected to other electrical or electronic elements (not shown) on the substrate 1802. For example, one or more of the terminals 1814 can be electrically connected to other terminals, vias, other traces, electronic components, an input or output of an electronic circuit, etc. (not shown) on or in the substrate 1802. As mentioned above, substrate 102 of FIG. 1 can also include terminals like terminals 1814, although such terminals are not shown in FIG. 1. The wires 1804, 1806, 1808, 1810, 1812 can be bonded to the terminals 1814 using any technique or method for bonding electrically conductive wires to terminals. For example, without limitation, ultrasonic, ball, or wedge type wiring bonding techniques can be used to bond wires 1804, 1806, 1808, 1810, 1812 to terminals 1814.

The wires 1804, 1806, 1808, 1810, 1812 can form electrically conductive paths that can be used in place of the traces 104, 106, 108, 110, 112 in FIG. 1. In other words, the substrate 1802 of FIG. 18 with wires 1804, 1806, 1808, 1810, 1812 can be processed in accordance with the method shown in FIGS. 2-7 with wire 1804 taking the place of trace 104, wire 1806 taking the place of trace 106, wire 1808 taking the place of trace 108, wire 1810 taking the place of trace 110, and wire 1812 taking the place of trace 112. The result can be a device as generally shown in FIG. 7 except wires 1804, 1808, 1812 take the place of traces 104, 108, 112 and wires 1806, 1808 can take the place of traces 106, 110. In such a configuration, wires 1804, 1808, 1812 can be electrically connected to vias 304, 306, 308 through terminals 1814, and wires 1806, 1808 can be electrically connected to other electronic components or elements on or in substrate 1802 through terminals 1814 and electrically conductive traces, vias (not shown), etc. Electrically conductive wires, like wires 1804, 1806, 1808, 1810, 1812, can take the place of any electrically conductive trace disclosed herein and/or shown in the drawings.

Figure 19:
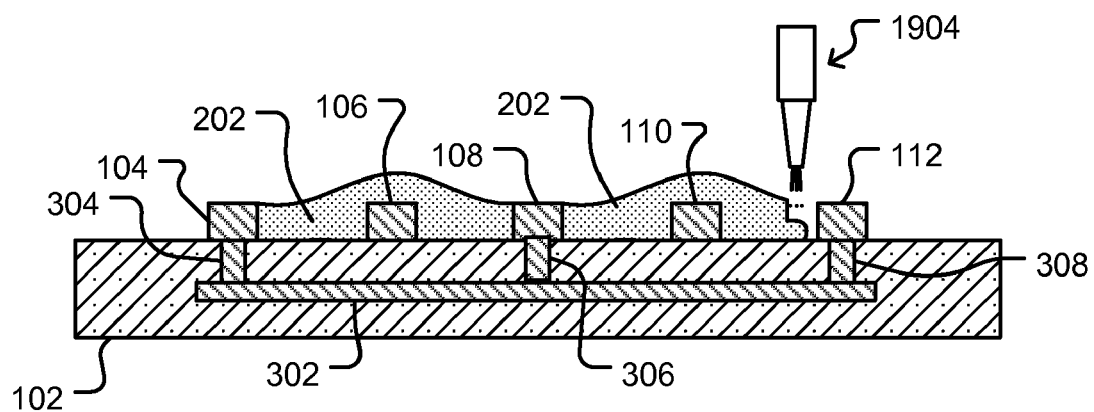
FIG. 19 illustrates an exemplary method of applying electrically insulating material using a dispensing head according to some embodiments of the invention.
Figure 20:
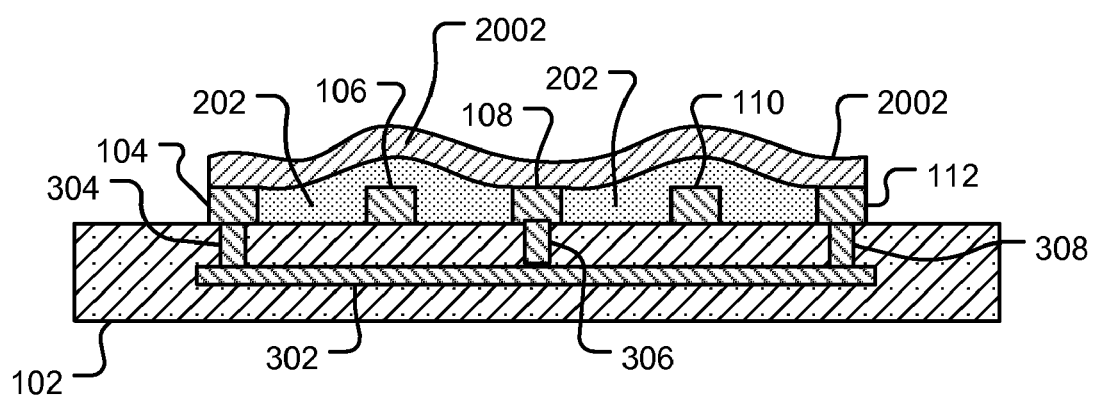
FIG. 20 illustrates exemplary deposition of conductive material according to some embodiments of the invention.
Figure 21:
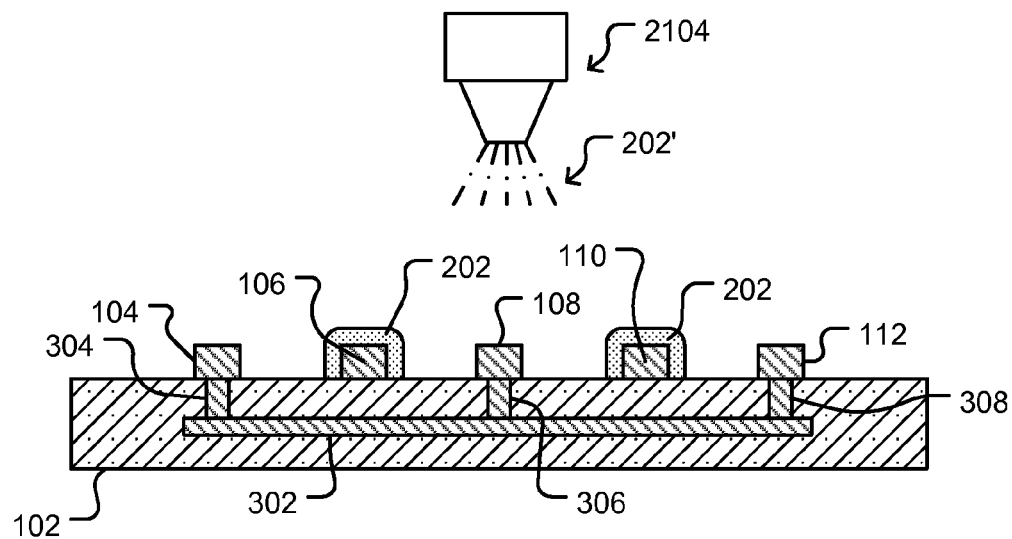
FIG. 21 illustrates another exemplary method of applying electrically insulating material according to some embodiments of the invention.
Figure 22:
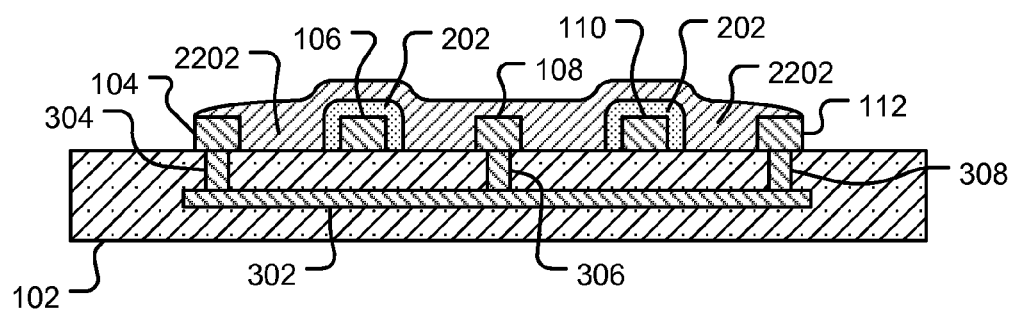
FIG. 22 illustrates exemplary deposition of conductive material according to some embodiments of the invention.

FIGS. 19-22 illustrate exemplary modifications and alternatives to the process shown in FIGS. 1-7. For example, FIGS. 19 and 21 illustrate exemplary methods of depositing insulating material 202 (and thus can be alternatives to FIGS. 2 and 3), and FIGS. 20 and 22 illustrate alternatives to FIGS. 4-7.

FIG. 19 illustrates an exemplary method of depositing electrically insulating material 202 on the substrate 102 and traces 104, 106, 108, 110, 112 of FIG. 1 according to some embodiments of the invention. As shown, the electrically insulating material 202 can be deposited onto the substrate 102 using a dispensing head 1904 (e.g., a laser print head, such as an ink jet print head, or other type of spray head). In some embodiments, the dispensing head 1904 can be configured to dispense the electrically insulating material 202 with sufficient precision to deposit selectively the insulating material 202 on the substrate and signal traces 106, 110 without also depositing the insulating material 202 on guard traces 104, 108, 112. Thus, as an alternative to depositing insulating material 202 over each of the traces 104, 106, 108, 110, 112 as shown in FIGS. 2 and 3, the insulating material 202 can be selectively deposited over only the signal traces 106, 110 without depositing the insulating material 202 over the guard traces 104, 108, 112. In such a case, holes 402, as shown in FIGS. 4 and 5) need not be formed in the insulating material 202. Rather, as shown in FIG. 20, conductive material 2002 can be deposited over the guard traces 104, 108, 112 and insulating material 202. The conductive material 2002 can be like and can be deposited like conductive material 602 shown in FIG. 602. Although not shown in FIG. 20, the conductive material 2002 can extend to the left of trace 104 onto substrate 102 and to the right of trace 112 onto substrate 102. The conductive material 2002 can be equivalent to—and can replace—the cover 702 shown in FIG. 7. Otherwise, the device shown in FIG. 20 can be generally like the device shown in FIG. 7.

FIG. 21 illustrates another exemplary method of depositing electrically insulating material 202 on the substrate 102 and traces 104, 106, 108, 110, 112 of FIG. 1 according to some embodiments of the invention. In the method illustrated in FIG. 21, the insulating material 202 can be electrically charged before or as it is dispensed from a dispensing head 2104 (which can be generally like the dispensing head 1904). The traces on which the insulating material 202 is to be deposited can be electrically charged with a charge that is a polar opposite of the charge of the insulating material 202. Traces on which the insulating material 202 is not to be deposited can be charged with a charge that is the same as the charge of the insulating material 202. For example, in the example shown in FIG. 21, the guard traces 104, 108, 112 can be electrically charged with the same charge (e.g., positive) as the insulating material 202, and the signal traces 106, 110 can be charged with an opposite charge (negative) from the insulating material 202. The oppositely charged signal traces 106, 110 will attract the charged insulating material 202' dispensed (e.g., sprayed) from the dispensing head 2104, and the similarly charged guard traces 104, 108, 112 will repel the charged insulating material 202' dispensed (e.g., sprayed) from the dispensing head 2104. The result can generally be as shown in FIG. 21: the insulating material 202 can be deposited substantially only on the signal traces 106, 110 without an appreciable amount of the insulating material 202 depositing on the guard traces 104, 108, 112.

As discussed above with respect to FIGS. 19 and 20, holes 402, as shown in FIGS. 4 and 5, need not be formed in the insulating material 202 deposited as shown in FIG. 21. Rather, as shown in FIG. 22, conductive material 2202 can be deposited over the guard traces 104, 108, 112 and insulating material 202. The conductive material 2202 can be like and can be deposited like conductive material 602 shown in FIG. 6. Although not shown in FIG. 22, the conductive material 2202 can extend to the left of trace 104 onto substrate 102 and to the right of trace 112 onto substrate 102. The conductive material 2202 can be like the conductive material 602 and can form a cover structure generally equivalent to cover structure 702 shown in FIG. 7. Otherwise, the device shown in FIG. 22 can be like the device shown in FIG. 7.

Figure 23:
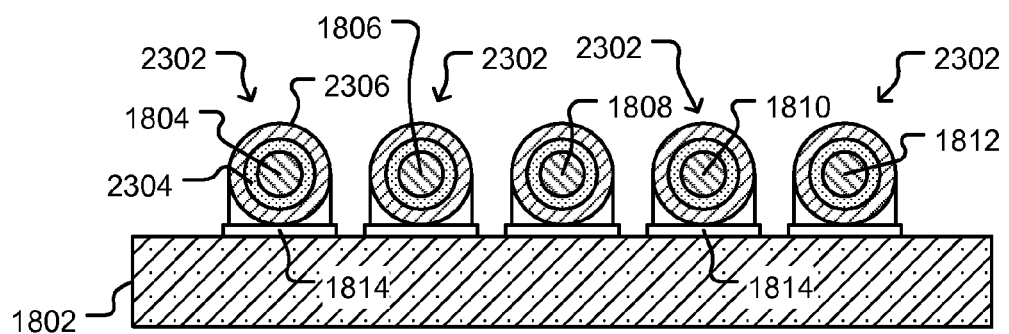
FIGS. 23 and 24 illustrate exemplary structures that can be formed according to some embodiments of the invention.

FIG. 23 illustrates an exemplary device in which an electrically insulating material layer 2304 and an outer electrically conductive layer 2306 are formed on each of wires 1804, 1806, 1808, 1810, 1812 (see FIG. 18) to form coaxial signal conductors 2302 according to some embodiments of the invention. Insulating material layers 2304 can be selectively deposited onto each of wires 1804, 1806, 1808, 1810, 1812 using a deposition technique such as the technique shown in FIG. 21. The insulating material layers 2304 can comprise insulating material like insulating material 202. The outer conductive layer 2304 can be like and can be deposited like the conductive material 602 of FIG. 6. In some embodiments, the outer conductive layer 2304 can be connected to ground or another voltage potential, which can be static or dynamic. Alternatively, the outer conductive layer 2304 can be left electrically floating.

Figure 24:
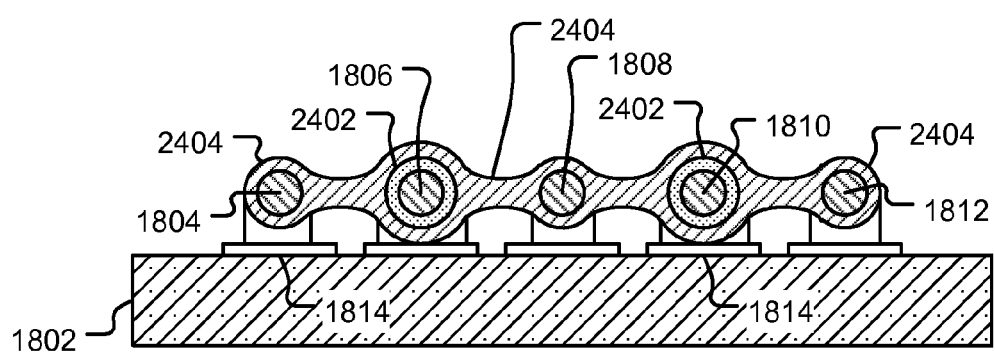

FIG. 24 illustrates yet another exemplary device that can be constructed according to some embodiments of the invention. In FIG. 24, electrically insulating material 2402 can be deposited selectively only on wires 1806, 1810 as shown. The insulating material 2402 can be deposited only on the wires 1806, 1810 using a technique like the technique illustrated in FIG. 21. For example, the insulating material 2402 (which can be like insulating material 202) can be deposited from a dispensing head (e.g., like dispensing head 2104) with an electrical charge. Wires 1804, 1808, 1812 can be charged with the same electrical charge, and wires 1806, 1810 can be charged with an opposite (polar) charge. As discussed above with respect to FIG. 21, the insulating material 2402 will be attracted to—and thus deposit on—only the oppositely charged wires 1806, 1810. An electrically conductive material 2404 can be deposited onto the wires 1804, 1808, 1812 and insulating material 2402 around wires 1806, 1810 as shown in FIG. 24. The resulting device shown in FIG. 24 can be functionally equivalent to the structure shown in FIG. 7 or FIG. 22. For example, wires 1806, 1810 can be signal paths like traces 106, 110. Wires 1804, 1808, 1812 and conductive material 2404 can function as guard structures electrically guarding wires 1806, 1810 in the same way that cover structure 702 and traces 104, 108, 112 guard traces 106, 110 in FIG. 7. Although not shown in FIG. 24, a conductive plane like plane 302 of FIG. 7 can be embedded in substrate 1802 and vias like vias 304, 306, 308 can electrically connect wires 1804, 1808, 1812 (through ones of terminals 1814) to the plane embedded within substrate 1802.

The alternative techniques and configurations shown in FIGS. 18-24 can thus be alternatives or variations to the method shown in FIGS. 1-7 and the device shown in FIG. 7. The techniques and configurations shown in FIGS. 18-24 can also be alternatives or variations to any of the methods or devices shown in any of FIGS. 8-17. For example, wires like wires 1804, 1806, 1808, 1810, 1812 can replace one or more of the traces 1006, 1008 in FIGS. 15-17. As another example, any of the configurations shown in FIGS. 18-24 can replace the guard structures 1102 shown in FIGS. 16 and 17.

Although specific embodiments and applications of the invention have been described in this specification, there is no intention that the invention be limited these exemplary embodiments and applications or to the manner in which the exemplary embodiments and applications operate or are described herein.

I claim:

1. A probe card assembly comprising:
   a plurality of probes disposed to contact an electronic device to be tested;
   a substrate;
   an electrical signal conductor disposed on the substrate, the signal conductor being part of an electrical path to one of the probes;
   a pair of electrically conductive guard conductors disposed on the substrate, wherein the signal conductor is disposed between the pair of the guard conductors;
   insulating material disposed outside of the substrate and on the signal conductor; and
   a layer of electrically conductive material disposed outside of the substrate and on the insulating material and electrically connected to the guard conductors.

2. The probe card assembly of claim 1, wherein:
   the insulating material is also disposed on the guard conductors;
   the insulating material comprises holes to the guard conductors; and
   the layer of electrically conductive material is electrically connected to the guard conductors through the holes.

3. The probe card assembly of claim 2, wherein the electrically conductive material fills the holes.

4. The probe card assembly of claim 2, wherein:
   the insulating material is disposed on less than an entire portion of the signal conductor and less than an entire portion of the guard conductors; and
   the electrically conductive material is disposed on less than an entire surface of the insulating material.

5. The probe card assembly of claim 1 further comprising:
   a plurality of electrically conductive signal conductors disposed on the substrate, the signal conductors being part of electrical paths to ones of the probes; and
   a plurality of electrically conductive guard conductors disposed on the substrate, wherein ones of the signal conductors are disposed between pairs of the guard conductors,
   wherein the insulating material is disposed on the signal conductors, and
   the electrically conductive material disposed on the insulating material is electrically connected to the guard conductors.

6. The probe card assembly of claim 5 further comprising:
   wherein the insulating material is also disposed on the guard conductors and comprises holes to the guard conductors, and
   the electrically conductive material is electrically connected to the guard conductors through the holes.

7. The probe card assembly of claim 5 further comprising an electrical interface to a tester, wherein the conductive signal conductors are part of electrical paths between the electrical interface and ones of the probes.

8. The probe card assembly of claim 5, wherein ones of the probes are attached to the substrate.

9. The probe card assembly of claim 5, wherein ones of the signal conductors are connectable to a source of test signals for testing the electronic device.

10. The probe card assembly of claim 5, wherein at least one of the conductive material and the guard conductors are connectable to a connection to ground voltage potential.

11. The probe card assembly of claim 5, wherein the substrate comprises:
    an embedded electrically conductive plane embedded in the substrate, and
    a plurality of electrically conductive vias electrically connecting the guard conductors and the conductive plane.

12. The probe card assembly of claim 5, wherein the signal conductors and the guard conductors comprise electrically conductive traces disposed on the substrate.

13. The probe card assembly of claim 5, wherein the signal conductors and the guard conductors comprise electrically conductive wires bonded to the substrate.

14. The probe card assembly of claim 1, wherein the signal conductor is disposed directly on an outer surface of the substrate.

15. The probe card assembly of claim 14, wherein the pair of guard conductors is disposed directly on the outer surface of the substrate.

16. The probe card assembly of claim 15, wherein the insulating material is disposed in part directly on the outer surface of the substrate between the pair of guard conductors.

17. The probe card assembly of claim 14, wherein the insulating material is disposed in part directly on the outer surface of the substrate adjacent the signal conductor.

18. The probe card assembly of claim 1, wherein at least part of the insulating material is disposed between the conductive material and the substrate.

19. The probe card assembly of claim 18, wherein the signal conductor is disposed between at least part of the conductive material and the substrate.

20. The probe card assembly of claim 1, wherein the signal conductor is disposed between at least part of the conductive material and the substrate.

* * * * *